US008780660B2

(12) United States Patent
Peng

(10) Patent No.: US 8,780,660 B2
(45) Date of Patent: Jul. 15, 2014

(54) SPURIOUS INDUCED CHARGE CLEANUP FOR ONE TIME PROGRAMMABLE (OTP) MEMORY

(75) Inventor: Jack Z. Peng, San Jose, CA (US)

(73) Assignee: Chengdu Kiloway Electronics Inc., Chengdu, Sichuan (CN)

(*) Notice: Subject to any disclaimer, the term of this patent is extended or adjusted under 35 U.S.C. 154(b) by 0 days.

(21) Appl. No.: 13/563,657

(22) Filed: Jul. 31, 2012

(65) Prior Publication Data

US 2013/0194885 A1 Aug. 1, 2013

Related U.S. Application Data

(63) Continuation-in-part of application No. 12/796,031, filed on Jun. 8, 2010, now Pat. No. 8,259,518.

(51) Int. Cl.
*G11C 7/02* (2006.01)

(52) U.S. Cl.
USPC .............. 365/206; 365/189.011; 365/189.02; 365/149; 365/230.06

(58) Field of Classification Search
USPC ......... 365/206, 189.011, 189.02, 149, 230.06
See application file for complete search history.

(56) References Cited

U.S. PATENT DOCUMENTS

| 5,999,447 A * | 12/1999 | Naura et al. ............. 365/185.04 |
| 7,130,209 B2 * | 10/2006 | Reggiori et al. ................ 365/94 |
| 7,457,152 B2 * | 11/2008 | Lee et al. ...................... 365/163 |
| 7,663,915 B2 * | 2/2010 | Kato ........................ 365/185.05 |
| 8,385,110 B2 * | 2/2013 | Bae .............................. 365/163 |
| 8,547,724 B2 * | 10/2013 | Lee et al. ...................... 365/100 |

* cited by examiner

*Primary Examiner* — Pho M Luu
(74) *Attorney, Agent, or Firm* — James Cai; Schein & Cai LLP

(57) ABSTRACT

A high density, low voltage, and low-power one time programmable (OTP) memory is based on core cells with a one transistor design. A CLEAN pulse is directed to a single shunt device at the output of the column decoder so spurious charges that may have been stored in the floating nodes can be cleaned up. Such arrangement also allows for the simultaneous initialization of bit lines, data lines, and sensing lines to zero. Core area layout size is substantially reduced, and operational power requirements are exceeding low making these particularly suitable in HF and UHF RFID applications.

15 Claims, 7 Drawing Sheets

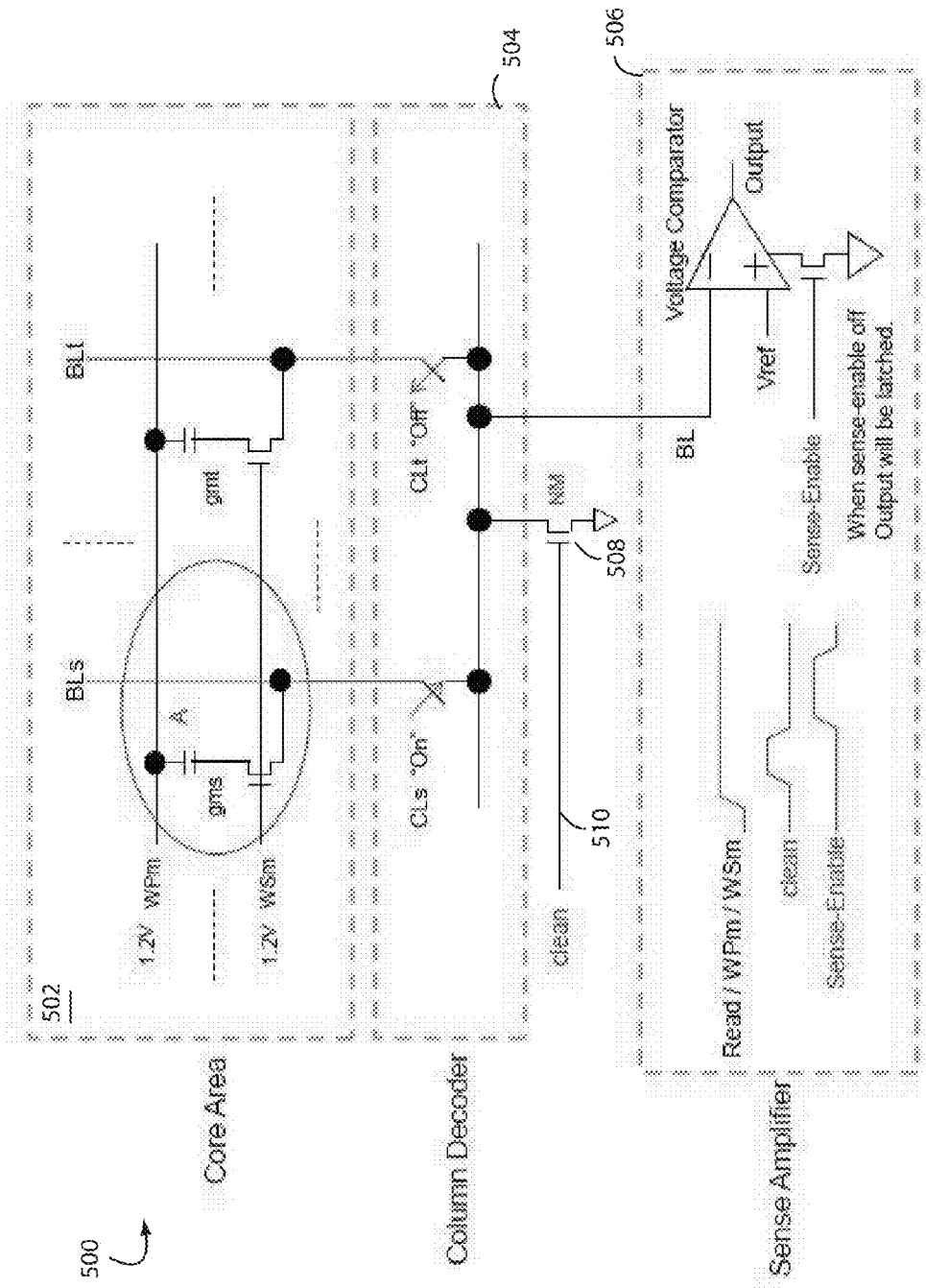

SPURIOUS INDUCED CHARGE CLEANUP FOR ONE TIME PROGRAMMABLE (OTP) MEMORY

RELATED APPLICATIONS

This Application is a continuation in part (CIP) of U.S. patent application Ser. No. 12/796,031, filed Jun. 08, 2010 now U.S. Pat. No. 8,259,518, issued on Sep. 4, 2012, and titled, A NEW LOW VOLTAGE AND LOW POWER XPM CELL, by the present inventors, Jack Zezhong Peng and David Fong. Such Parent Application received a Notice of Allowance that was mailed May 30, 2012.

FIELD OF THE INVENTION

The present invention relates to non-volatile memory (NVM) devices and memory cell circuits, and more specifically to high density, low voltage, and low-power one time programmable (OTP) core cells and memories important in HF and UHF RFID applications.

BACKGROUND

The core cells in some memory device types are based on NMOS field effect transistors and bit capacitors. The present inventor, Jack Peng, describes the conventional construction of one time programmable (OTP) memory cells in U.S. Pat. No. 6,667,902, issued Dec. 23, 2003. The circuit impedances are extremely high, and the capacitance values of the bit capacitors are very small. Spurious charges can be induced from nearby unintended sources causing the transistors to weakly turn on and their sense amplifiers to report a wrong data storage result.

Various circuits and methods have been developed in the prior art that apply clean up pulses in various ways to nullify the spurious charges on the floating nodes. Some of these add special circuits and more devices, substantially increasing the layout size and cost of the memory. Others apply the clean up pulses broadly and therefore this strategy demands higher power levels to support the cleanup operation that may not be possible in low power applications like passive UHF RFID tags.

SUMMARY OF THE INVENTION

Briefly, in one embodiment of the present invention, a high density, low voltage, and low-power one time programmable (OTP) memory is based on core cells with a one transistor design. A CLEAN pulse is directed to a single shunt device at the output of the column decoder so spurious charges that may have been stored in the floating nodes can be cleaned up. Such arrangement also allows for the simultaneous initialization of bit lines, data lines, and sensing lines to zero. Core area layout size is substantially reduced, and operational power requirements are exceeding low making these particularly suitable in UHF RFID applications.

These and other objects and advantages of the present invention will no doubt become obvious to those of ordinary skill in the art after having read the following detailed description of the preferred embodiments that are illustrated in the various drawing figures.

BRIEF DESCRIPTION OF THE DRAWINGS

FIGS. 5 and 6 are schematic diagrams of another high density, low voltage, and low-power one time programmable (OTP) memory and some exemplary core cells with a one transistor design, and in which a CLEAN pulse is directed to a single shunt device at the output of the column decoder so spurious charges that may have been stored in the floating nodes can be cleaned up.

DETAILED DESCRIPTION

Figure 1:
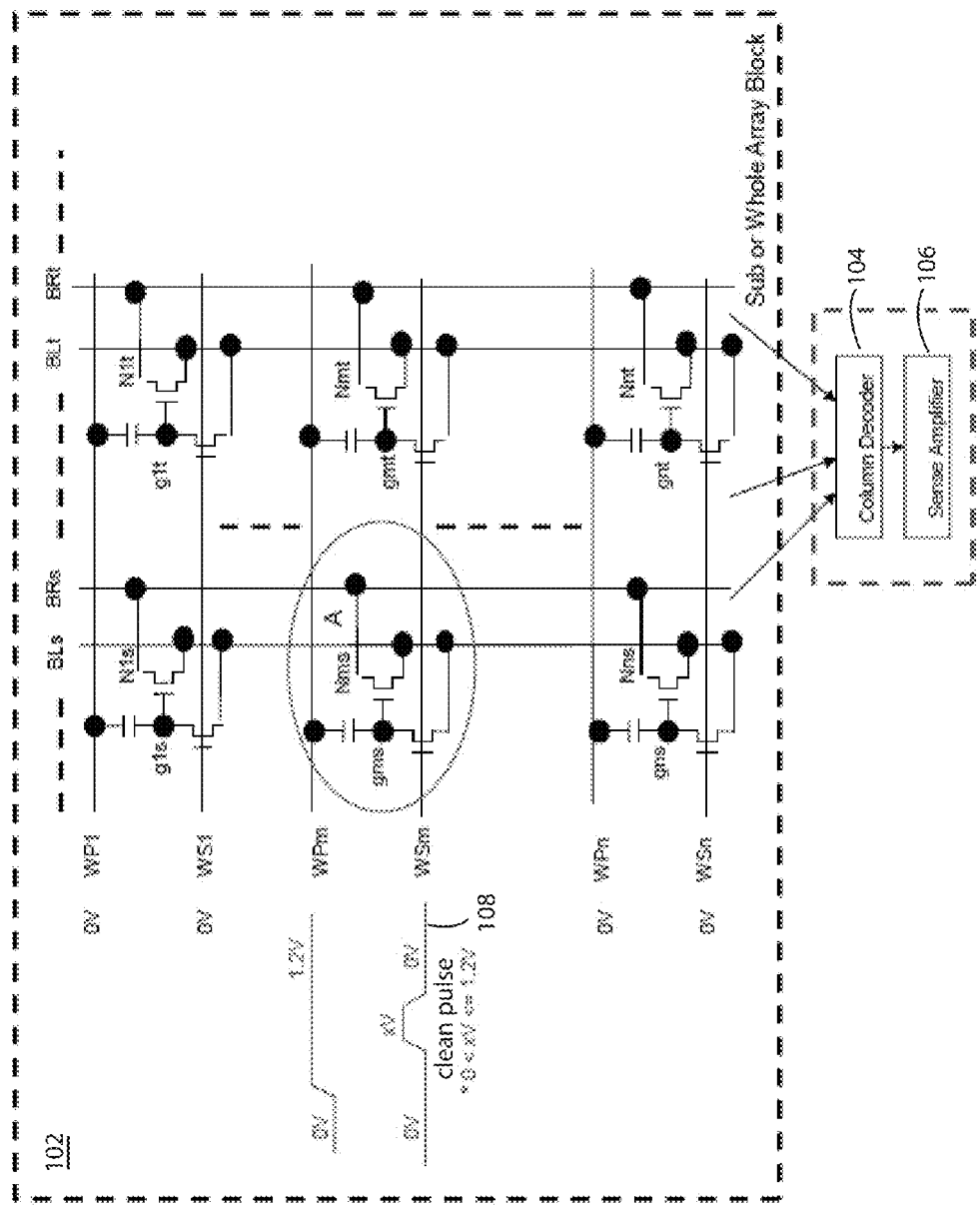
FIG. 1 is a schematic diagram of a low voltage, and low-power one time programmable (OTP) memory and some exemplary core cells with a two transistor design in which a CLEAN pulse is applied to respective WS lines for cleaning spurious charges that may have been stored in the floating nodes.

FIG. 1 and Voltage Table I represent a memory 100 comprising an array block 102 and core cells. Each core cell is based on two transistors (N) and one floating node comprising a capacitor C and gate g.

VOLTAGE TABLE I

|  | Cell | V(WP) | V(WS) | V(BL) | V(BR) |
|---|---|---|---|---|---|
| Programming | A SW/SB | 5.5 V | 2.5 V | 0 V | floating |
|  | B SW/UB | 5.5 V | 2.5 V | 2.5 V | floating |
|  | C UW/SB | 2.5 V | 0 V | 0 V | floating |
|  | D UW/UB | 2.5 V | 0 V | 2.5 V | floating |
| Read | A SW/SB | 1.0 V | 0 V | 0 V | V sensing + |
|  | B SW/UB | 1.0 V | 0 V | floating | floating |
|  | C UW/SB | 0 V | 0 V | 0 V | V sensing − |
|  | D UW/UB | 0 V | 0 V | floating | floating sensing line |

Where the voltage values can be +/− by 10%~50% for a 0.13 µm CMOS process, depends on the process and detailed implementation of the decoding circuits. In an 0.18 µm process, these voltages will be correspondingly higher.

In memory array block 102 the core cells are arranged in rows (m) and columns (s) with internal bit line (BLs) and bit read (BRs) interconnections to corresponding column decoders and sense amplifiers, and write pulse line (WP) and write sense line (WS) row (m) interconnections. Each core cell includes an NMOS transistor (Nms) with a floating gate connected through a node (Gms) to a bit capacitor (Cms). When a core cell has been previously programmed with data, its node (Gms) will typically express a voltage of about 0.4~0.9 v, and if it had not been previously programmed with data, node (Gms) will ideally express a voltage of about zero. But, when a write pulse line (WPm) is turned on from zero to about 1.0 v, node (Gms) may be induced to about 0.4 v which can weakly turn on a transistor (Nms) and cause a sense amplifier 106 to falsely report such core has been previously programmed. So, a mechanism to correct this situation can be used to apply a short, "clean pulse" CLEAN 108 on a corresponding write sense line (WSm) during a write program line (WPm) action to remove any residual charges that may be left on node (Gms).

Spurious voltages from nearby unintentional sources may also be induced into nodes (Gms) which can weakly turn on corresponding transistors (Nms) and cause false reports such have been previously programmed. A second mechanism can be used to apply a clean pulse on all the write sense lines (WSm) in parallel to remove any residual charges that may be left on nodes (Gms). But that comes at a cost in power consumption that may not be tolerable in particular mobile applications with limited power resources.

Figure 2A:
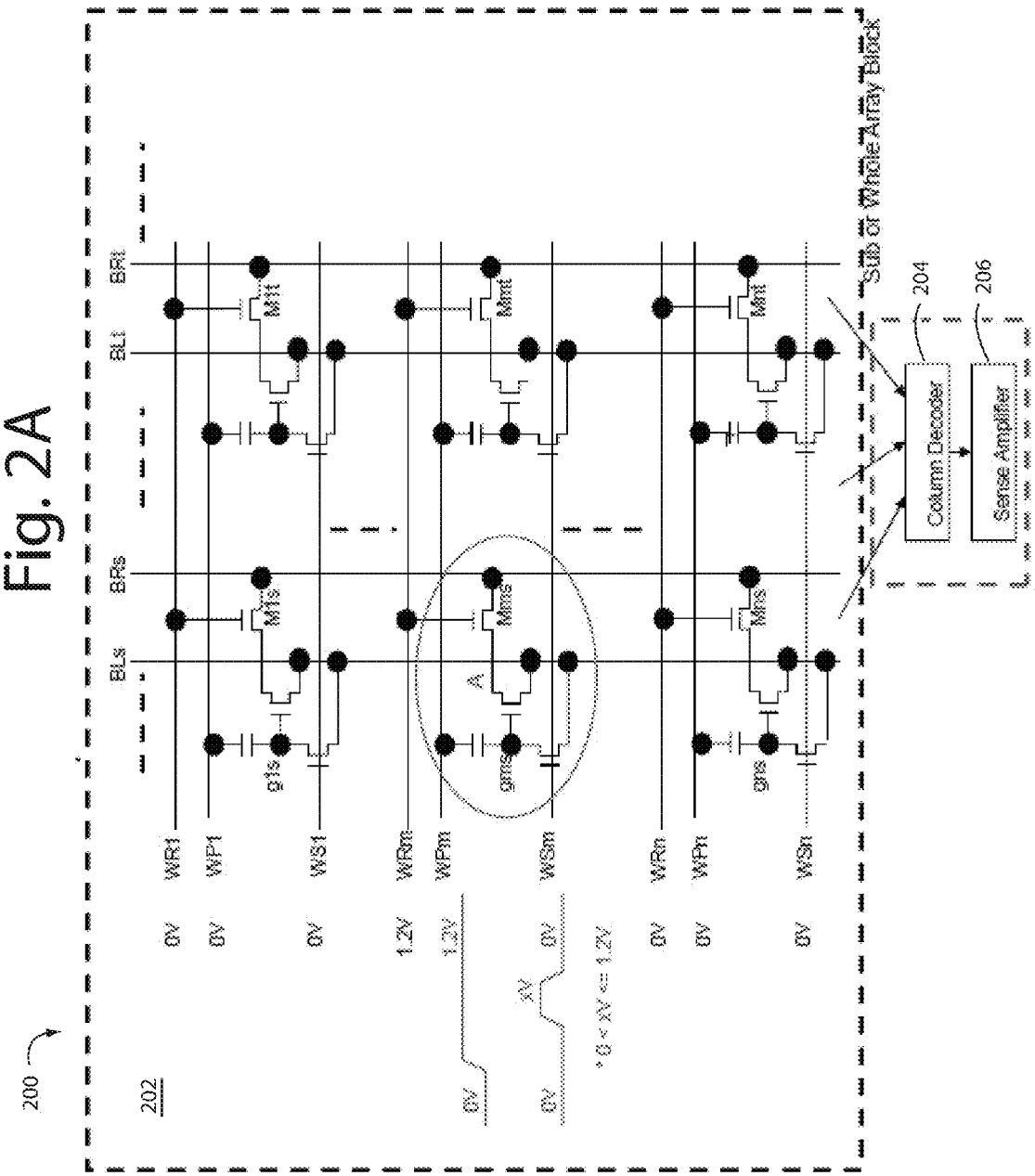
FIG. 2A is a schematic diagram of another low voltage, and low-power one time programmable (OTP) memory and some exemplary core cells with an extra isolation transistor M added to the basic two transistor design, and in which a CLEAN pulse is applied to respective WS lines for cleaning spurious charges that may have been stored in the floating nodes.
Figure 2B:
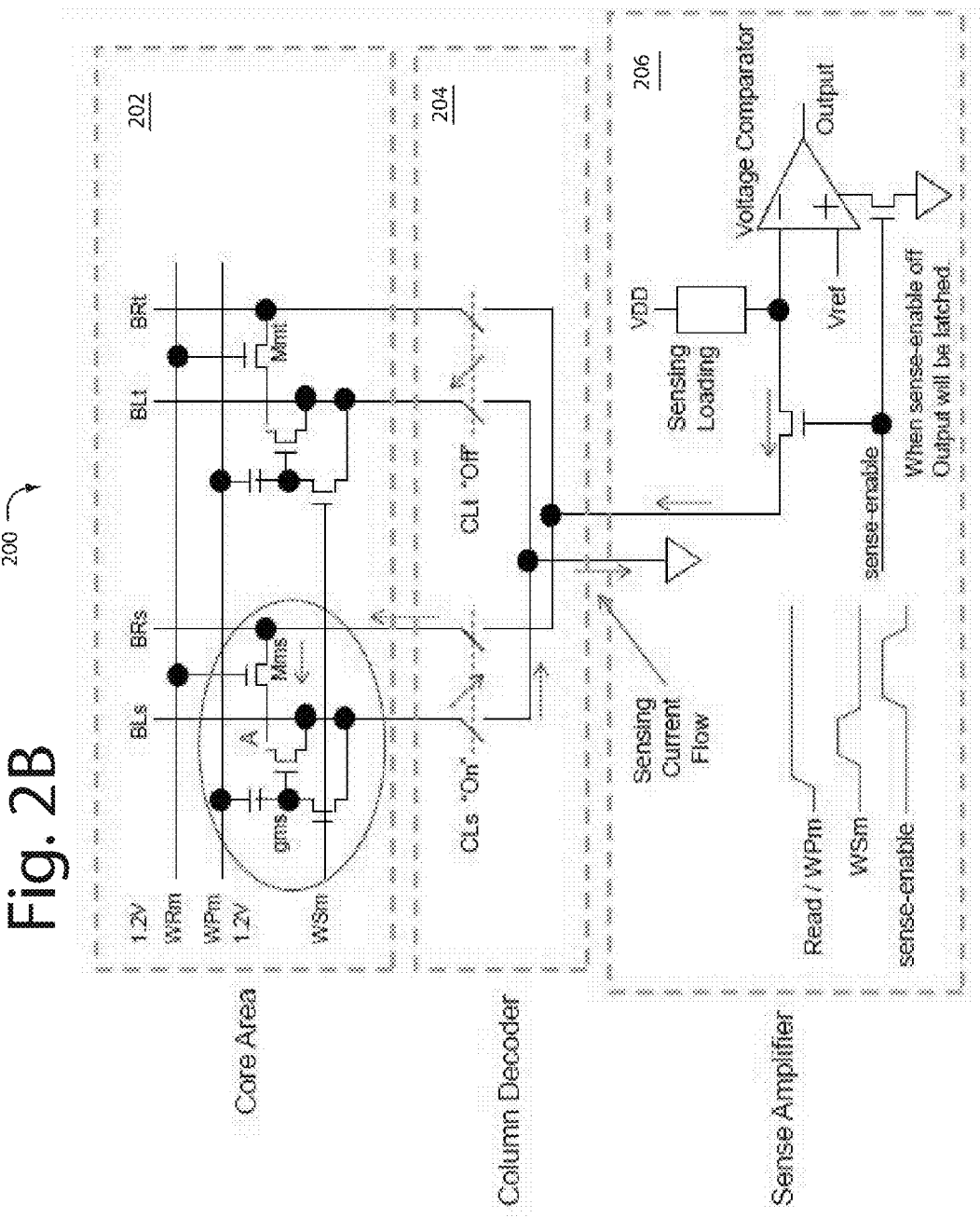
FIG. 2B is a schematic diagram showing an example of read sensing for the memory of FIG. 2A.

In one embodiment, an extra isolation device is added to limit the power consumed during clean pulses. FIGS. 2A-2B, and Voltage Table II represent a memory 200 comprising an array block 202 and exemplary core cells. Each core cell includes an extra isolation transistor (M) controlled by an extra set of write row (WR) control lines.

VOLTAGE TABLE II

| | Cell | V(WP) | V(WS) | V(WR) | V(BL) | V(BR) |
|---|---|---|---|---|---|---|
| Pro- | A SW/SB | 5.5 V | 2.5 V | 0 V | 0 V | float |
| gram- | B SW/UB | 5.5 V | 2.5 V | 0 V | 2.5 V | float |
| ming | C UW/SB | 2.5 V | 0 V | 0 V | 0 V | float |
| | D UW/UB | 2.5 V | 0 V | 0 V | 2.5 V | float |
| Read | A SW/SB | 1.0 V | pulse, 0 V | 1.0 V | 0 V | V sensing |
| | B SW/UB | 1.0 V | 0 V | 1.0 V | 0 V, float | 0 V, float |
| | C UW/SB | 0 V | 0 V | 0 V | 0 V | V sensing |
| | D UW/UB | 0 V | 0 V | 0 V | 0 V, float | 0 V, float sensing line |

Where the voltage values can be +/− by 10%~50% for 0.13 μm CMOS process, depends on the process and detailed implementation of the decoding circuits. For a 0.18 μm process, the exemplary voltages will be correspondingly higher. When reading a cell core A, all the other WP, WS and WR lines for the non-selected rows are set to zero. For the selected row, WRm should be held at 1.0 v, and WPm is switched from zero to 1.0 v. The corresponding WSm will require a short, clean positive pulse. The charges in all the other floating nodes g1s, ... g(m−1)s, ... g(m+1)s will not affect the core A reading result because all the isolation devices M1s, ... M(m−1)s, ... M(m+1)s, ... Mns, are turned off. So only one pulse on the selected WS line is needed, instead of being applied in parallel on all the WS lines, and saves a lot of power. In a 64×64 array, a 90% power savings can be realized for the WS clean pulse alone.

Unfortunately, while the clean pulse current is now limited, the extra isolation transistors (M) can add 20% to the core area layout size.

Figure 3:
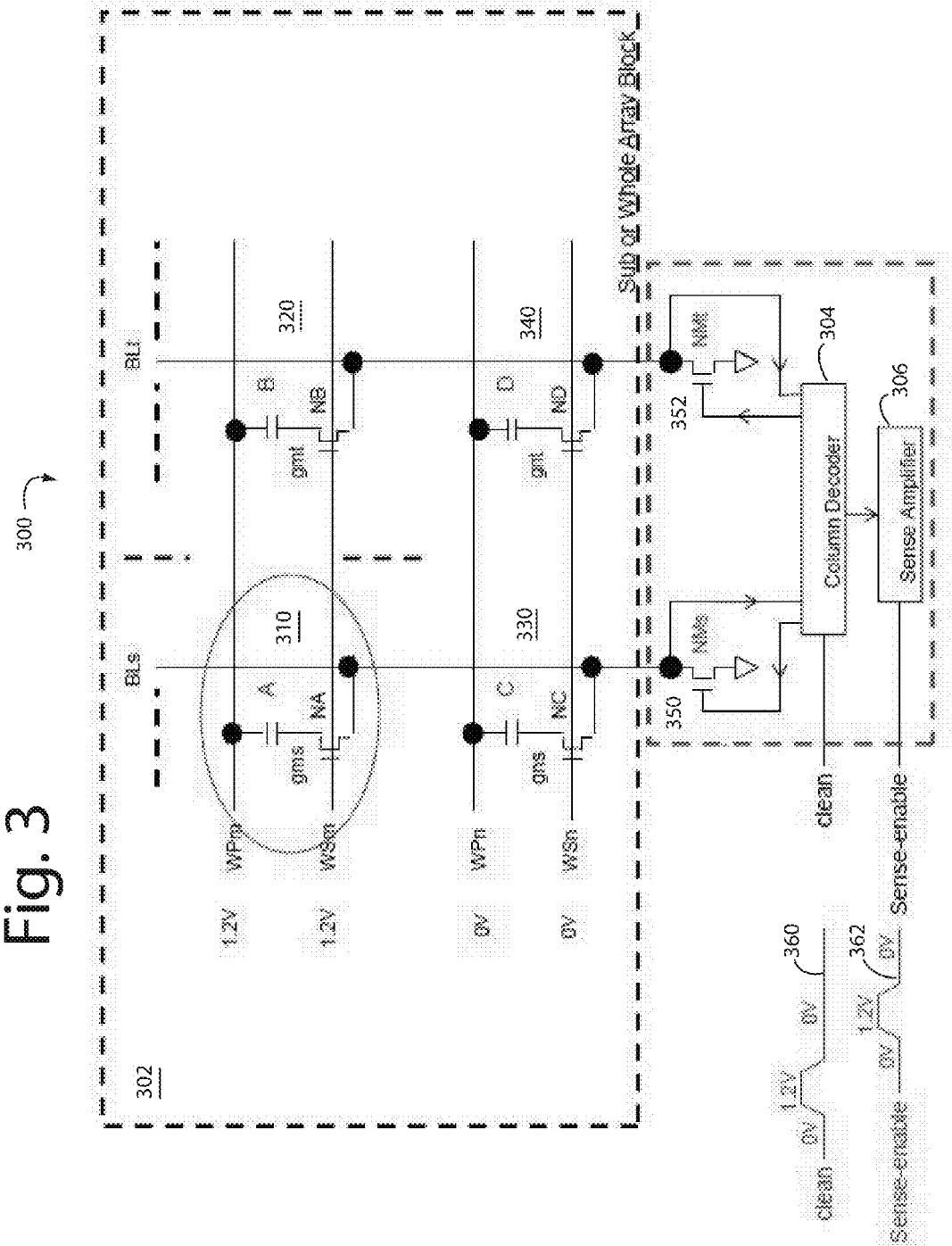
FIGS. 3 and 4 are schematic diagrams of a high density, low voltage, and low-power one time programmable (OTP) memory and some exemplary core cells with a one transistor design, and in which a CLEAN pulse is directed by the column decoder to selected BL column shunt devices so spurious charges that may have been stored in the floating nodes can be cleaned up.
Figure 4:
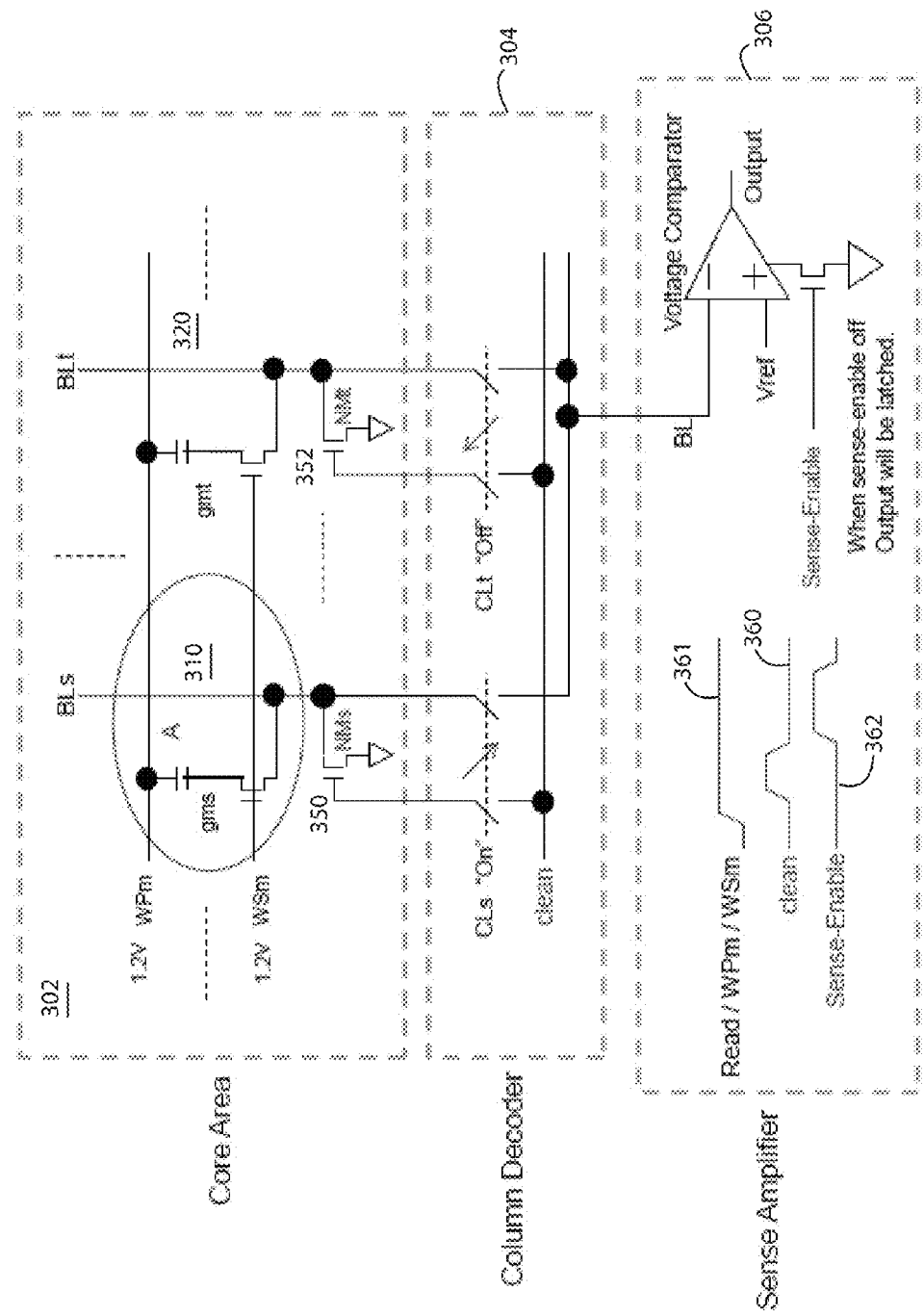

FIGS. 3-4, and Voltage Table III represent a memory 300 in an embodiment of the present invention. Memory 300 includes an array block 302, a column decoder 304, and a sense amplifier 306. The array block 302 is shown here with representative cell cores (A) 310, (B) 320, (C) 330, and (D) 340. FIG. 4 provides circuit details for an exemplary way to implement column decoder 304 and sense amplifier 306.

VOLTAGE TABLE III

| | Cell | V(WP) | V(WS) | V(BL) |
|---|---|---|---|---|
| Programming | A SW/SB | 5.5 V | 2.5 V | 0 V |
| | B SW/UB | 5.5 V | 2.5 V | 2.5 V |
| | C UW/SB | 2.5 V | 0 V | 0 V |
| | D UW/UB | 2.5 V | 0 V | 2.5 V |

VOLTAGE TABLE III-continued

| | Cell | V(WP) | V(WS) | V(BL) |
|---|---|---|---|---|
| Read | A SW/SB | 1.0 V | 0 V | 0 V |
| | B SW/UB | 1.0 V | 0 V | 0 V, float |
| | C UW/SB | 0 V | 0 V | 0 V |
| | D UW/UB | 0 V | 0 V | 0 V, float |

Where the voltage values can be +/− by 10%~50% for a 0.13 μm CMOS process, depends on the process and detailed implementation of the decoding circuits. In an 0.18 μm process, the voltages will be correspondingly higher.

In contrast with the cell cores of memory 200 in FIG. 2, devices M1s, Mms, Mns, M1t, Mmt, Mnt, . . . . have all been eliminated and their functions essentially replaced, in FIG. 3, by devices NMs 350 and NMt 352 on the columns. Such reduces each core cell to one device NA, NB, NC, or ND with one corresponding floating node gms, gmt, gns, or gnt, e.g., implemented with a half transistor. The present inventor, Jack Peng, describes the construction in greater detail in U.S. Pat. No. 7,269,047, issued Sep. 11, 2007. The size of core area 302 of memory 300 can be reduced by about 20% over that of memory 200 (FIG. 2).

However, floating node gms still needs to be cleaned by a short pulse CLEAN 360 after Wpm 361 (FIG. 4) goes on, and before SENSE-ENABLE 362 goes on.

Assume core A has been selected for reading. After selected WPm and WSm have been turned on, a short pulse of signal clean will remove all stored charges in node gms. All the other floating nodes in selected column BLs will not be affected, because their WS lines are turned off. See Voltage Table III. When CLEAN 360 goes off, the voltage level on the input node BL of the voltage comparator will be determined by the status of core A 310. If it has been previously programmed, then its BL will charge up to a high voltage level. If it has not, its BL will stay at a low level. When a SENSE-ENABLE 362 arrives, the status of core A 310 is sensed and thereafter latched.

In contrast to some conventional sensing schemes that need to separately initialize the voltage level of bit lines, data lines, and sense lines, embodiments of the present invention use the clean pulse to both clean any erroneously stored charges in the floating node, and to initialize the bit lines, data lines, and sensing lines to zero.

Power is conserved when reading core A because no DC current flows in non-selected bit line BLs. Memory 300 therefore retains most of the benefits provided by memory 200.

Figure 5:
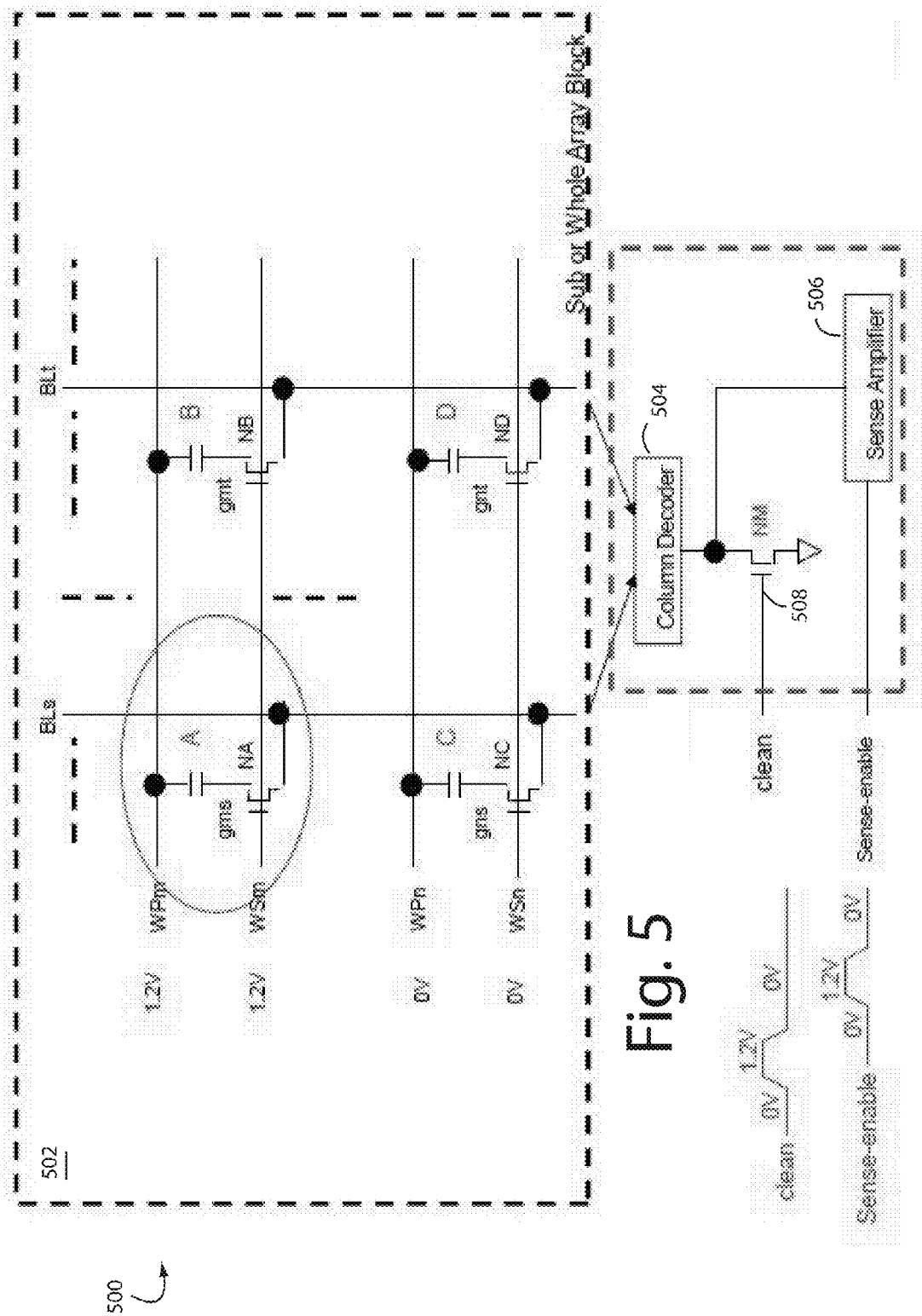

FIGS. 5 and 6 represent a memory 500 in an embodiment of the present invention alternative to memory 300. Voltage Table III applies here as well. Memory 500 includes a core array block 502, column decoders 504, and a sense amplifier 506. Instead of using individual transistors NM 350 and 352 (FIGS. 3 and 4) on each of the columns, memory 500 uses a single transistor NM 508 for spurious charge cleaning that shunts a connection between column decoder 504 and sense amplifier 506.

FIG. 6 shows some exemplary circuits in greater detail. Column selection between BLs and BLt to BL, for example, is highly simplified over the more complex way needed when individual transistors NM are needed in every column. CLEAN no longer needs to be steered to the selected column by the column decoder as it was in FIGS. 3 and 4. In FIGS. 5 and 6, CLEAN 510 is directed to a single transistor NM 508. Memory 500 therefore accomplishes its objectives in reduced operating power and minimal layout area.

Although the present invention has been described above with reference to preferred embodiments, those skilled in the art will readily appreciate that various modifications and improvements of the described embodiment s can be implemented without departing from the spirit and scope of the invention as defined by the claims of this application.

What is claimed is:

1. A method for sensing and reading core cells in memories (300), comprising:
configuring each core cell in a memory array block to include a single transistor N with only a first end of a floating node capacitor C connected to its drain, wherein rows of transistors N and capacitors C are interconnected by their gates to a write select (WS) line, and a second end of capacitor C is connected to a write program (WP) line, and the sources of each of transistors N in columns are interconnected by a corresponding bit line (BL) to a switch in a column decoder;
shunting a common line between all the column switches in the column decoder and the BL-input of a voltage comparator in a sense amplifier with a CLEAN pulse transistor NM; and
simultaneously cleaning any stored charges in the floating nodes and initializing the bit lines, data lines, and sensing lines to zero by pulsing a CLEAN pulse transistor NM on while its WS and WP lines are held low;
wherein, DC currents are prevented from flowing in bit line BLs when reading a core cell and such thereby conserves overall power consumption.

2. The method of claim 1, wherein:
the configuring of each core cell is such that transistor N comprises a field effect transistor.

3. The method of claim 1, wherein:
the configuring of each core cell is such that capacitor C is fabricated as a field effect transistor with a thinner gate oxide.

4. An improved low power one-time programmable (OTP) cell and memory (200), comprising:
a memory array block comprising a core area of a plurality of memory core cells arranged in rows (m) and columns (s) with internal bit line (BLs) and bit read (BRs) interconnections to corresponding column decoders and sense amplifiers, and further including write pulse line (WP) and write sense line (WS) row (m) interconnections;
wherein, each memory cell or core includes an NMOS transistor (Nms) with a floating gate connected through a node (Gms) to a bit capacitor (Cms);
wherein, each memory cell or core is such that if it had been previously programmed with data, said node (Gms) will typically express a voltage of about 0.4~0.9 v, and if it had not been previously programmed with data, said node (Gms) will ideally express a voltage of about zero;
but wherein, when a write pulse line (WPm) is turned on from zero to about 1.0 v, the node (Gms) may be induced to about 0.4 v which can weakly turn on a transistor (Nms) and cause a sense amplifier to falsely report such core has been previously programmed;
the improvement comprising:
a circuit to apply a CLEAN pulse on a corresponding write sense line (WSm) following a write program line (WPm) action to remove any residual charges that may be left on node (Gms).

5. The improved OTP cell and memory of claim 4, wherein:
each of the a plurality of memory core cells is a three transistor configuration.

6. The improved OTP cell and memory of claim 4, wherein:
each transistor comprises a field effect transistor.

7. The improved OTP cell and memory of claim 4, wherein:
the bit capacitor (Cms) is fabricated as a field effect transistor with a thinner gate oxide.

8. The improved OTP cell and memory of claim 4, wherein:
a selected BR line is connected through a sense enable transistor to a sensing load and a voltage comparator to produce an output from the sense amplifier.

9. An improved low power one-time programmable (OTP) cell and memory (100), comprising:
a memory array block comprising a plurality of memory core cells arranged in rows (m) and columns (s) with internal bit line (BLs) and bit read (BRs) interconnections to corresponding column decoders and sense amplifiers, and further including write pulse line (WP) and write sense line (WS) row (m) interconnections;
wherein, each memory cell or core includes an NMOS transistor (Nms) with a floating node (Gms) connected to a bit capacitor (Cms);
wherein, each memory cell or core is such that if it had been previously programmed with data, said node (Gms) will typically express a voltage of about 0.4~0.9 v, and if it had not been previously programmed with data, said node (Gms) will ideally express a voltage of about zero;
but wherein, spurious voltages from nearby unintentional sources can be induced into nodes (Gms) which can weakly turn on corresponding transistors (Nms) and cause their respective sense amplifiers to falsely report such have been previously programmed;
the improvement comprising:
a circuit configured to apply a voltage pulse (108) on all write sense lines (WSm) to remove any residual charges that may be left on nodes (Gms).

10. The improved OTP cell and memory of claim 9, wherein:
each of the a plurality of memory core cells is a three transistor configuration.

11. The improved OTP cell and memory of claim 9, wherein:
each transistor comprises a field effect transistor.

12. The improved OTP cell and memory of claim 9, wherein the following voltage table describes its general operation:

VOLTAGE TABLE

|  | Cell | V(WP) | V(WS) | V(BL) | V(BR) |
| --- | --- | --- | --- | --- | --- |
| Programming | A SW/SB | 5.5 V | 2.5 V | 0 V | floating |
|  | B SW/UB | 5.5 V | 2.5 V | 2.5 V | floating |
|  | C UW/SB | 2.5 V | 0 V | 0 V | floating |
|  | D UW/UB | 2.5 V | 0 V | 2.5 V | floating |
| Read | A SW/SB | 1.0 V | 0 V | 0 V | V sensing + |
|  | B SW/UB | 1.0 V | 0 V | floating | floating |
|  | C UW/SB | 0 V | 0 V | 0 V | V sensing − |
|  | D UW/UB | 0 V | 0 V | floating | floating sensing line | wherein, said voltage values can be +/− by 10%~50% for a 0.13 μm CMOS process, and depends on the process and particular implementation of the decoding circuits, and in an 0.18 μm process, such voltages can be correspondingly higher.

13. An improved low power one-time programmable (OTP) cell and memory, comprising:
a memory array block comprising a plurality of memory core cells arranged in rows (m) and columns (s) with internal bit line (BLs) and bit read (BRs) interconnections to corresponding column decoders and sense amplifiers, and further including write pulse line (WP) and write sense line (WS) row (m) interconnections;

wherein, each memory cell or core includes an NMOS transistor (Nms) with a floating node (Gms) connected to a bit capacitor (Cms);

wherein, each memory cell or core is such that if it had been previously programmed with data, said node (Gms) will typically express a voltage of about 0.4~0.9 v, and if it had not been previously programmed with data, said node (Gms) will ideally express a voltage of about zero;

but wherein, spurious voltages from nearby unintentional sources can be induced into nodes (Gms) which can weakly turn on corresponding transistors (Nms) and cause their respective sense amplifiers to falsely report such have been previously programmed;

the improvement comprising:

an NMOS isolation transistor (M) disposed in a read path so as to eliminate floating charges on a floating note (Gms) of any unselected core cells;

wherein, the selection of only one WS line, instead all the WS lines, is required to have a voltage pulse applied on WPm to discharge a floating note;

wherein, power consumption is substantially reduced thereby for every read cycle.

14. The improved OTP cell and memory of claim 13, further comprising:
a number of WR lines for controlling respective rows of the NMOS isolation transistors (M).

15. The improved OTP cell and memory of claim 13, wherein the following voltage table describes its general operation:

VOLTAGE TABLE

| Cell | | V(WP) | V(WS) | V(WR) | V(BL) | V(BR) |
|---|---|---|---|---|---|---|
| Pro- | A SW/SB | 5.5 V | 2.5 V | 0 V | 0 V | float |
| gram- | B SW/UB | 5.5 V | 2.5 V | 0 V | 2.5 V | float |
| ming | C UW/SB | 2.5 V | 0 V | 0 V | 0 V | float |
| | D UW/UB | 2.5 V | 0 V | 0 V | 2.5 V | float |
| Read | A SW/SB | 1.0 V | pulse, 0 V | 1.0 V | 0 V | V sensing |
| | B SW/UB | 1.0 V | 0 V | 1.0 V | 0 V, float | 0 V, float |
| | C UW/SB | 0 V | 0 V | 0 V | 0 V | V sensing |
| | D UW/UB | 0 V | 0 V | 0 V | 0 V, float | 0 V, float sensing line | wherein, the voltage values can be +/− by 10%~50% for 0.13 µm CMOS process, depending on the process and particular implementation of the decoding circuits, and for a 0.18 µm process, such voltages can be correspondingly higher.

* * * * *